United States Patent
Li et al.

(10) Patent No.: US 8,884,404 B2
(45) Date of Patent: Nov. 11, 2014

(54) MECHANISM OF PATTERNING A SEMICONDUCTOR DEVICE AND PRODUCT RESULTING THEREFROM

(75) Inventors: Yi-Fang Li, Baoshan Township (TW); Chun-Li Lin, Hsinchu (TW); Chun-Sheng Wu, Hsinchu (TW); Ding-I Liu, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 161 days.

(21) Appl. No.: 13/409,931

(22) Filed: Mar. 1, 2012

(65) Prior Publication Data

US 2013/0228899 A1    Sep. 5, 2013

(51) Int. Cl.
*H01L 29/02* (2006.01)

(52) U.S. Cl.
USPC ....... 257/622; 257/774; 257/E21.04; 438/702

(58) Field of Classification Search
USPC .................. 257/622, E29.002, E21.214, 704; 438/702, 629, 637, 639, 640, 667, 700, 438/701, 713
See application file for complete search history.

(56) References Cited

U.S. PATENT DOCUMENTS 6,008,117 A * 12/1999 Hong et al. .................. 438/629

* cited by examiner

*Primary Examiner* — Roy Potter
(74) *Attorney, Agent, or Firm* — Lowe Hauptman & Ham, LLP

(57) ABSTRACT

The description relates to a method of patterning a semiconductor device to create a through substrate via. The method produces a through substrate via having no photoresist material therein. An intermediate layer deposited over an interlayer dielectric prevents etching solutions from etching interlayer dielectric sidewalls to prevent peeling. The description relates to a semiconductor apparatus including a semiconductor substrate having a through substrate via therein. The semiconductor apparatus further includes an interlayer dielectric over the semiconductor substrate and an intermediate layer over semiconductor substrate and over sidewalls of the interlayer dielectric.

20 Claims, 5 Drawing Sheets

MECHANISM OF PATTERNING A SEMICONDUCTOR DEVICE AND PRODUCT RESULTING THEREFROM

BACKGROUND

Three dimensional integrated circuits are formed by interconnecting stacked dies using Through Substrate Vias (TSVs). TSVs provide electrical connection through a substrate to an adjacent die. The quality of the electrical connection affects whether the three dimensional integrated circuit functions as designed.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion.

DESCRIPTION

The following disclosure provides many different embodiments, or examples, for implementing different features of the invention. Specific examples of components and arrangements are described below to simplify the present disclosure. These are of course, merely examples and are not intended to be limiting.

Figure 1:
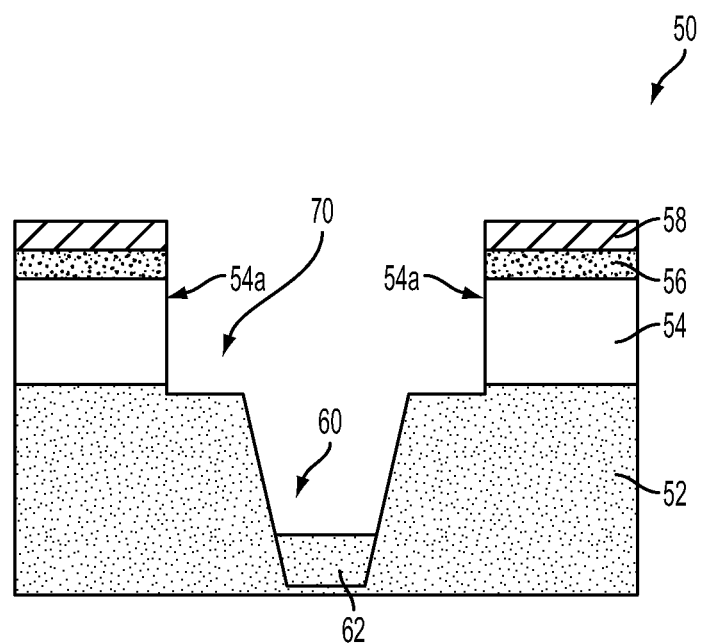
FIG. 1 is a side view diagram of a semiconductor device according to conventional techniques.

FIG. 1 is a side view diagram of a semiconductor device 50 including a semiconductor substrate 52. An interlayer dielectric 54 is over a portion of semiconductor substrate 52. A first passivation layer 56 is over interlayer dielectric 54 and a second passivation layer 58 is over first passivation layer 56. A through substrate via (TSV) 60 is formed in semiconductor substrate 52. Residual photoresist 62 is in a bottom portion of TSV 60. Semiconductor device 50 further includes an opening 70 defined by semiconductor substrate 52 on the bottom and sidewalls 54a of interlayer dielectric 54 on the sides. In some embodiments, opening 70 is used to form a bond pad.

Techniques for forming TSVs often leave behind photoresist material in the TSVs. In techniques where the TSVs are formed prior to other features, a photoresist layer is deposited within the TSVs to protect the size and shape of the TSVs from further etching. Following the formation of the other features, the photoresist material is removed, however, removal is often incomplete within the TSVs and additional removal steps are necessary. The additional steps to remove photoresist material prior to metallization for the TSVs to properly function, thereby increasing production time and cost.

In conventional techniques, TSV 60 is formed prior to opening 70. When TSV 60 is formed prior to opening 70, a photoresist material used to define the size of opening 70 is deposited into TSV 60 to prevent further etching of TSV 60. The photoresist material is difficult to remove and in some instances residual photoresist 62 remains in TSV 60 following the removal process. When residual photoresist 62 remains in TSV 60, residual photoresist 62 prevents adequate metallization of TSV 60. The extra steps required for removal of residual photoresist 62 increases production time and costs.

Additionally, sidewalls 54a are exposed. The exposed sidewalls 54a are prone to peeling resulting from contact with etching material or to other damage. Damage to sidewalls 54a can result in loss of electrical connection between lines and vias in interlayer dielectric 54. The resulting interlayer dielectric 54 does not properly transfer signals between elements of semiconductor device 50. Damage to sidewalls 54a can decrease product yield and thereby increase overall production costs.

Figure 2:
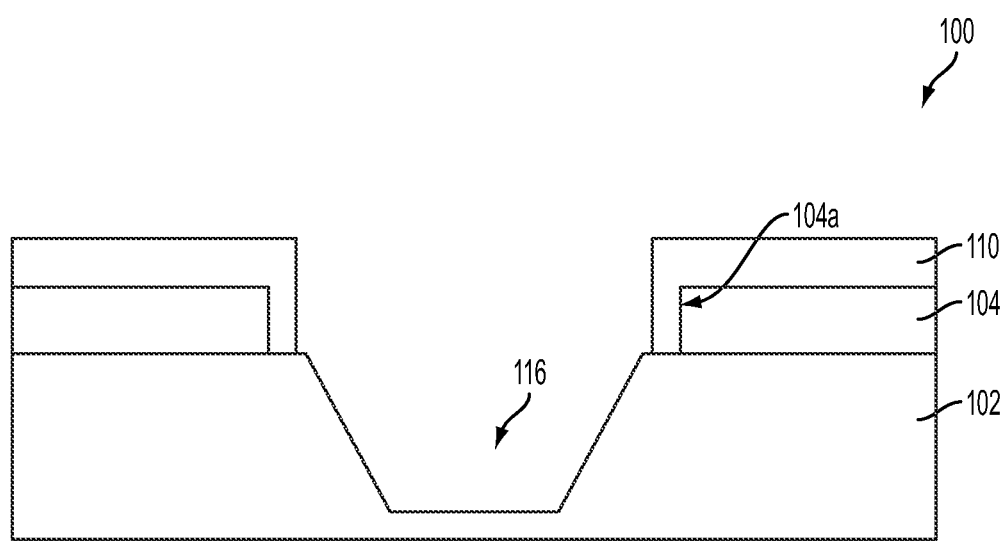
FIG. 2 is a side view diagram of a semiconductor device according to some embodiments.

FIG. 2 is a side view diagram of a semiconductor device 100 including a semiconductor substrate 102. An interlayer dielectric 104 is over a portion of semiconductor substrate 102. An intermediate layer 110 is over interlayer dielectric 104 and covers a sidewall 104a of interlayer dielectric 104. A TSV 116 is formed in semiconductor substrate 102. In some embodiments, TSV 116 has a depth ranging from 10 μm to 200 μm.

In the embodiment of FIG. 2, semiconductor substrate 102 is silicon. In other embodiments, semiconductor substrate 102 is any of silicon-germanium, gallium arsenide, or other suitable semiconductor materials.

Interlayer dielectric 104 is a low k dielectric material. A low k dielectric material has a dielectric constant, k, below about 3.5. Low k dielectric materials include silicon carbide, silicon nitride, aerogel, and other suitable materials.

Intermediate layer 110 is a passivation material comprising silicon nitride. In other embodiments, intermediate layer 110 is silicon dioxide, titanium dioxide, silicon oxynitride or other suitable materials. In an embodiment, the thickness of intermediate layer 110 ranges from about 300 nanometers (nm) to about 600 nm. In at least some embodiments, the portion of intermediate layer 110 covering sidewalls 104a of interlayer dielectric 104 helps to prevent peeling at the sidewalls by acting as a barrier to etchants used to form semiconductor device 100.

TSV 116 does not penetrate through semiconductor substrate 102. In some embodiments, TSV 116 penetrates through semiconductor substrate 102. TSV 116 has a width ranging from about 155 μm to about 175 μm. Filling TSV 116 with conductive material will enable electrical connection between semiconductor device 110 and other devices. The conductive material includes aluminum, copper, tungsten, conductive polymer, or other suitable conductive material. In some embodiments, TSV 116 has a rectangular shape when viewed from above. In some embodiments, TSV 116 has a circular or oval shape when viewed from above.

Figure 4:
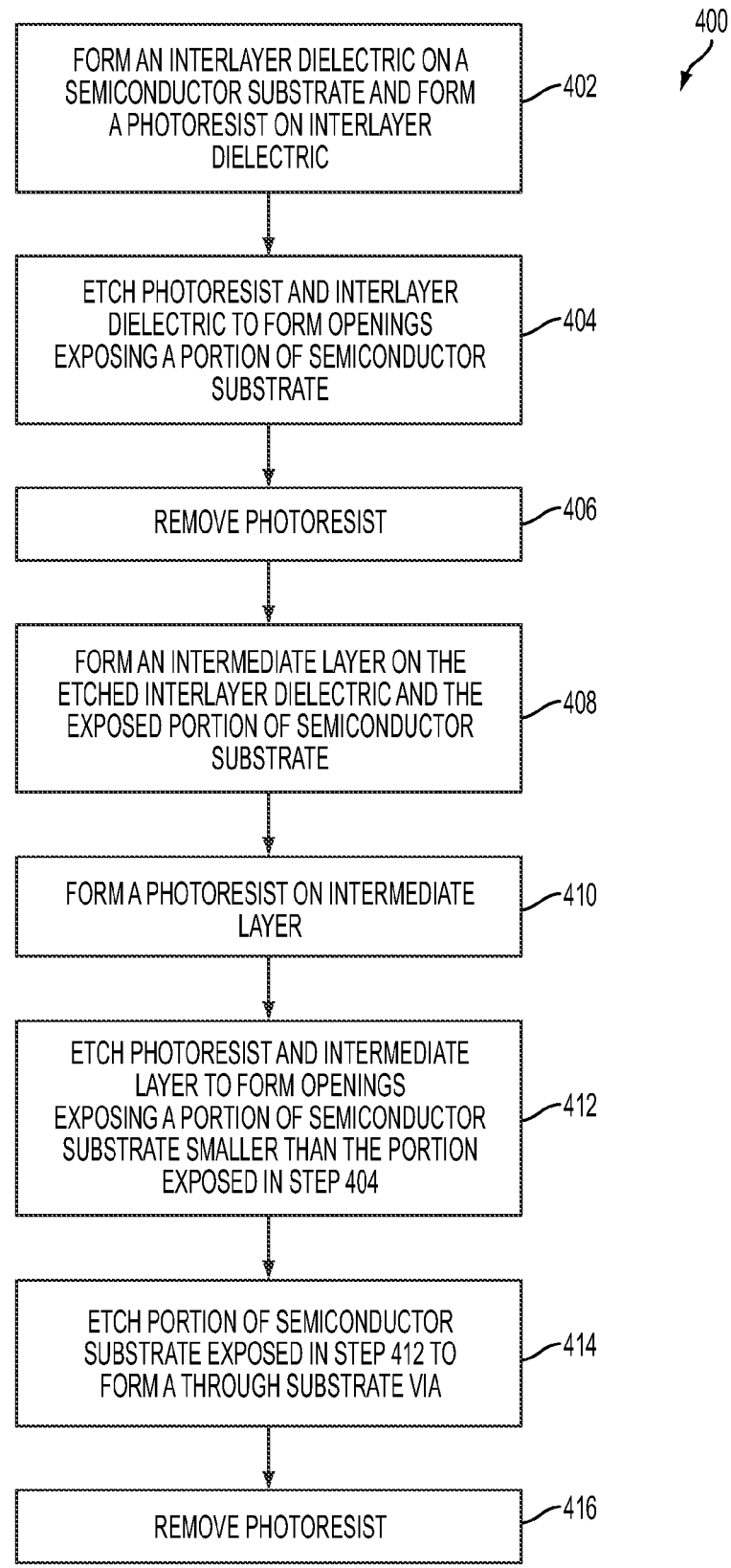
FIG. 4 is a flow chart of a method of making a semiconductor device according to some embodiments.

FIG. 4 is a flow chart of a method 400 of making a semiconductor device according to an embodiment, e.g., semiconductor device 100 (FIG. 2). In some embodiments, method 400 is used to form TSVs in a semiconductor substrate and openings for bump structures or other suitable electrical connections. In some embodiments, method 400 is used to form vias in an interconnect structure and openings for conductive lines in the interconnect structure.

Figure 3A:
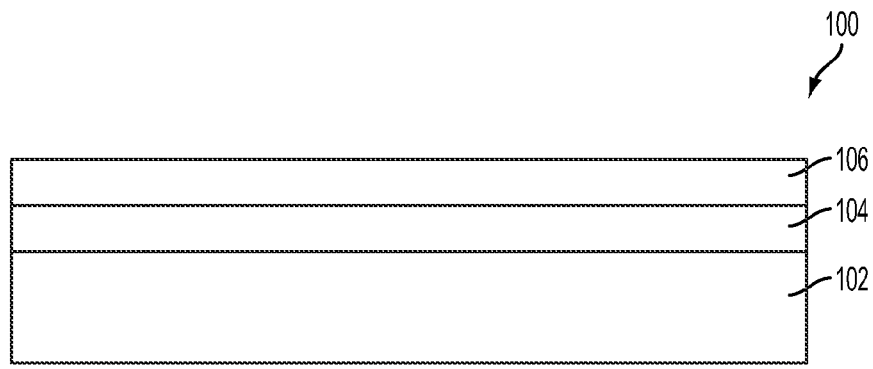
FIGS. 3A-3E are side view diagrams of a semiconductor device at various stages of development according to some embodiments.

Method 400 begins with step 402, in which interlayer dielectric 104 is formed on semiconductor substrate 102 and photoresist 106 is formed on the interlayer dielectric for forming the structure of FIG. 3A. Interlayer dielectric 104 is deposited on the semiconductor substrate using any of chemical vapor deposition, physical vapor deposition; plasma enhanced chemical vapor deposition, or other suitable deposition methods.

In the embodiment of FIGS. 3A-3E, photoresist 106 is a positive photoresist. In other embodiments, photoresist 106 is a negative photoresist. The photoresist is cured by passing radiation through a patterned mask. The mask includes openings corresponding with the geometry and position on the surface of interlayer dielectric 104 of features to be etched into the interlayer dielectric at a portion of the interlayer dielectric covered by a cured portion of photoresist 106.

In the embodiment of FIGS. 3A-3E, photoresist 106 is placed over interlayer dielectric 104 using a photolithography process. In other embodiments, photoresist 106 is deposited using any one of printing, lithographic processes, or other suitable methods.

In at least some embodiments, an optional passivation layer 120 is formed between interlayer dielectric 104 and photoresist 106. In an embodiment, the passivation layer is silicon nitride. In other embodiments, the passivation layer is silicon dioxide, titanium dioxide or other suitable materials In step 404, photoresist 106 and interlayer dielectric 104 are etched to form openings 108 in the interlayer dielectric and expose a first region 102a of semiconductor substrate 102. In an embodiment, the width of first region 102a ranges from about 215 μm to about 315 μm. In the embodiment of FIGS. 3A-3E, the etching process is a dry etching process.

Upon completion of the etching process used to form openings 108, photoresist 106 deposited during step 402 is removed during step 406. In the embodiment of FIGS. 3A-3E, after etching is finished, photoresist 106 is removed using a wet chemistry process. In other embodiments, photoresist 106 is removed by any of a dry chemistry process, selective etching, plasma ashing, or other suitable methods.

In step 408, an intermediate layer 110 is formed on the etched interlayer dielectric 104 and the first portion of semiconductor substrate 102.

Figure 3B:
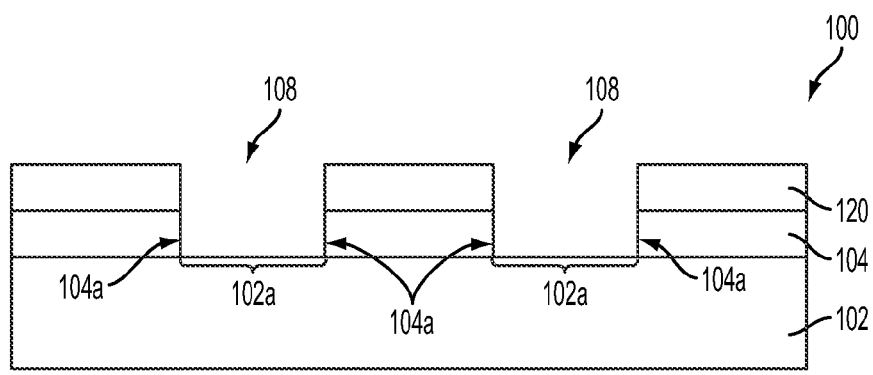
Figure 3C:
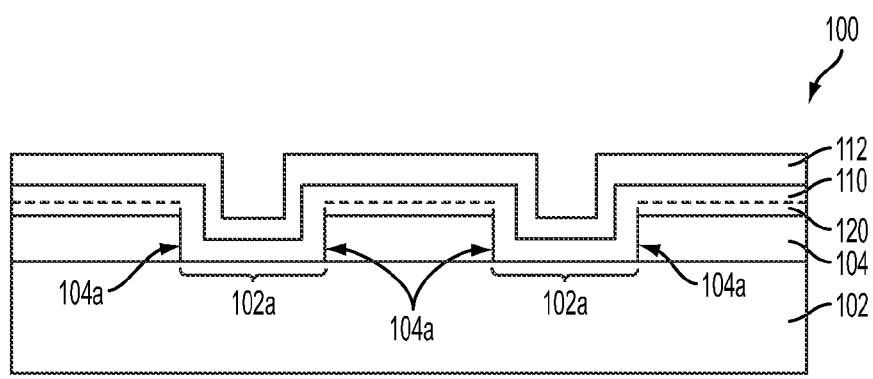
Figure 3D:
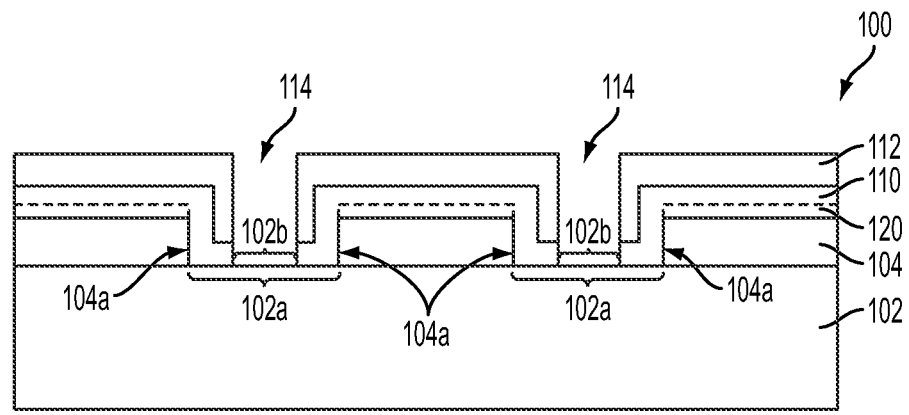

The etching process of step 404 forms exposed sidewalls 104a in interlayer dielectric 104. If the structure shown in FIG. 3B is subjected to an etching process, the etchant will remove material from the sidewalls 104a of interlayer dielectric 104 and increases the likelihood of peeling. Peeling of interlayer dielectric 104 can disconnect features formed within the interlayer dielectric such as metallized lines and vias. If these features are disconnected, an integrated circuit (IC) will not function properly. Intermediate layer 110 covers the sidewalls 104a of interlayer dielectric 104, as shown in FIG. 3C. Intermediate layer 110 provides a barrier between etchants used in a subsequent etching process and the sidewalls of interlayer dielectric 104 in order to prevent peeling. In some embodiments, intermediate layer 110 is deposited using physical vapor deposition. In some embodiments, intermediate layer 110 is deposited using chemical vapor deposition, plasma deposition, sputtering, or other suitable deposition methods.

In step 410, a photoresist 112 is formed on intermediate layer 110. In the embodiment of FIGS. 3A-3E, photoresist 112 is a positive photoresist. In other embodiments, photoresist 112 is a negative photoresist. The photoresist is cured by passing radiation through a patterned mask.

In the embodiment of FIGS. 3A-3E, photoresist 112 is placed over intermediate layer 110 using a photolithography process. In other embodiments, photoresist 112 is deposited using any one of printing, lithographic processes, or other suitable methods.

In step 412, photoresist 112 and intermediate layer 110 are etched to form openings 114 exposing a second region 102b of semiconductor substrate 102. In an embodiment, the width of second region 102b ranges from about 155 μm to about 175 μm. The second region 102b of semiconductor substrate 102 is smaller than the first region 102a of semiconductor substrate 102 exposed in step 404. Opening 108 of FIG. 3B is wider than opening 114 of FIG. 3D. The portion of intermediate layer 110 and photoresist 112 covering the sidewalls of interlayer dielectric 104 account for the difference in size between the first portion and the second portion of semiconductor substrate 102.

The compound used to etch intermediate layer 110 and photoresist 112 depends on the intermediate layer material and the type of feature the etching is intended to create (e.g. hole via, trench, etc.). In the embodiment of FIGS. 3A-3E, the etching process used in step 412 is the same as the etching process in step 404.

In step 414, the second region 102b of semiconductor substrate 102 is etched to form a Through Substrate Via (TSV) 116. In some embodiments, TSV is formed by wet etching the substrate. In the embodiment of FIGS. 3A-3E, the etching process is a wet etching process using potassium hydroxide. In other embodiments, the etching process uses sodium hydroxide, cesium hydroxide or other suitable materials. The wet etching process submerges the entire semiconductor device in an etching solution. The etching solution removes not only substrate material but also material from other layers in the semiconductor device. An interlayer dielectric is particularly vulnerable to etching at the sidewalls adjacent the TSV.

The etching process in step 414 also forms an opening 122 above TSV 116. In some embodiments, opening 122 is used to form a bond pad.

As the technology nodes shrink, the use of low k dielectrics to form interlayer dielectric increases. Low k dielectrics permit features to be spaced closer together by reducing parasitic capacitance. Low k dielectrics however are generally more porous than other materials and thus more susceptible to etching. Removal of material at the sidewalls of the interlayer dielectric can result in peeling, which can cause separation between lines and vias in the semiconductor device, thus reducing yield.

Figure 3E:
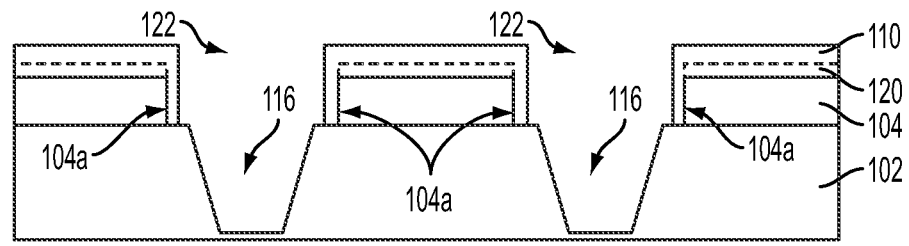

After completion of the etching process used to form TSV 116, the photoresist 112 deposited during step 410 is removed during step 416 to form the structure of FIG. 3E. In the embodiment of FIGS. 3A-3E, after etching is finished, photoresist 112 is removed using a wet chemistry process. In other embodiments, photoresist 112 is removed by any one of a dry chemistry process, selective etching, plasma ashing, or other suitable methods.

TSV 116 has no photoresist material within the TSV opening because the TSV is formed after the deposition of photoresists 106 and 112. The structure of FIG. 3E, therefore, does not suffer from the problem of photoresist material blocking metallization of the TSV. The method 400, therefore, eliminates the need for additional steps to remove photoresist material from TSV 116 making production faster and less expensive than other techniques. In some embodiments, a semiconductor device formed according to method 400 has a higher yield than other techniques because photoresist cleaning methods are not always successful.

It has been found that the use of intermediate layer 110 eliminates peeling in interlayer dielectric 104. Etchants used to form TSV 116 do not come into contact with the sidewalls of interlayer dielectric 104; therefore no material is removed from interlayer dielectric. The elimination of peeling results in devices with higher yield because electrical connections within the device are preserved.

In some embodiments, after removal of photoresist 112 a metal material is formed in TSV 116. In some embodiments, the metal material is formed by plating, physical vapor deposition, or other suitable processes. Following formation of the metal material, excess metal material is removed by a chemical mechanical planarizing (CMP) process. In some embodiments, the metal material is formed in opening 122 concurrently with formation of the metal material in TSV 116. In some embodiments, a separate metal material is formed in opening 122 in a separate process from forming the metal material in TSV 116.

One aspect of the description relates to a method of patterning a semiconductor device by forming an interlayer dielectric on a semiconductor substrate, etching the interlayer dielectric to expose a first portion of the semiconductor substrate and form interlayer dielectric sidewalls, forming an intermediate layer over the etched interlayer dielectric including the interlayer dielectric sidewalls and the first portion of the semiconductor substrate, etching the intermediate layer to expose a second portion of the semiconductor substrate, and etching the second portion of the semiconductor substrate to form a through substrate via.

Another aspect of the description relates to a method of patterning a semiconductor device by forming an interlayer dielectric on a semiconductor substrate, etching the interlayer dielectric to expose a first portion of the semiconductor substrate and form interlayer dielectric sidewalls, forming an intermediate layer over the etched interlayer dielectric including the interlayer dielectric sidewalls and the first portion of the semiconductor substrate, etching the intermediate layer to expose a second portion of the semiconductor substrate, and etching the second portion of the semiconductor substrate to form a through substrate via, where etching the second portion of the semiconductor substrate is a wet etching process, and no photoresist material is present in the through substrate via.

Still another aspect of the description relates to a semiconductor apparatus including a semiconductor substrate having a through substrate via therein. The semiconductor apparatus further includes an interlayer dielectric over the semiconductor substrate and an intermediate layer over the semiconductor substrate. The intermediate layer is over sidewalls of the interlayer dielectric.

The above description discloses exemplary steps, but they are not necessarily required to be performed in the order described. Steps can be added, replaced, changed in order, and/or eliminated as appropriate, in accordance with the spirit and scope of embodiment of the disclosure. Embodiments that combine different claims and/or different embodiments are within the scope of the disclosure and will be apparent to those skilled in the art after reviewing this disclosure.

What is claimed is:

1. A method of patterning a semiconductor device comprising:
    forming an interlayer dielectric on a semiconductor substrate;
    etching the interlayer dielectric to expose a first region of the semiconductor substrate and form interlayer dielectric sidewalls;
    forming an intermediate layer over the etched interlayer dielectric, interlayer dielectric sidewalls and the first region of the semiconductor substrate;
    etching the intermediate layer to expose a second region of the semiconductor substrate;
    etching the second region of the semiconductor substrate to form a through substrate via.

2. The method of claim 1, further comprising forming a photoresist on the interlayer dielectric and curing the photoresist to define a pattern etched into the interlayer dielectric, prior to etching the interlayer dielectric.

3. The method of claim 1, wherein the step of forming the intermediate layer comprises depositing a passivation layer over the etched interlayer dielectric, interlayer dielectric sidewalls and the first region of the semiconductor substrate.

4. The method of claim 3, wherein depositing the passivation layer comprises depositing a silicon nitride layer over the etched interlayer dielectric, interlayer dielectric sidewalls and the first region of the semiconductor substrate.

5. The method of claim 1, wherein the step of etching the intermediate layer comprises dry etching the intermediate layer.

6. The method of claim 5, further comprising blocking, using the intermediate layer, an etchant used in the wet etching from contacting the interlayer dielectric sidewalls.

7. The method of claim 1, wherein the step of etching the second region of the semiconductor substrate forms the through substrate via free of photoresist material.

8. The method of claim 1, wherein the step of etching the interlayer dielectric exposes a wider area of the semiconductor substrate than the step of etching the intermediate layer.

9. The method of claim 1, wherein the step of forming the interlayer dielectric comprises depositing a low k dielectric material on the semiconductor substrate, wherein the dielectric constant, k, is less than 3.5.

10. The method of claim 1, further comprising depositing a passivation layer on the interlayer dielectric, prior to etching the interlayer dielectric.

11. The method of claim 10, wherein the passivation layer and the intermediate layer comprise the same material.

12. A method of patterning a semiconductor device comprising:
    forming an interlayer dielectric on a semiconductor substrate;
    etching the interlayer dielectric to expose a first region of the semiconductor substrate and form interlayer dielectric sidewalls;
    forming an intermediate layer on the etched interlayer dielectric, interlayer dielectric sidewalls and the first region of the semiconductor substrate;
    etching the intermediate layer to expose a second region of the semiconductor substrate;
    etching the second region of the semiconductor substrate to form a through substrate via, wherein
    the etching the intermediate layer is performed as a wet etching process, and
    the through substrate via is free of photoresist material.

13. The method of claim 12, wherein the step of forming an intermediate layer comprises depositing a silicon nitride layer over the etched interlayer dielectric, interlayer dielectric sidewalls and the first region of the semiconductor substrate.

14. The method of claim 12, further comprising blocking, using the intermediate layer, an etchant used in the step of etching the second region of the semiconductor substrate from contacting the interlayer dielectric sidewalls.

15. The method of claim 12, wherein the step of etching the interlayer dielectric exposes a wider area of the semiconductor substrate than the step of etching the intermediate layer.

16. A method of patterning a semiconductor device comprising:
    forming a dielectric layer on a substrate;
    exposing a first region of the substrate by forming an opening in the dielectric layer;

forming an intermediate layer over the dielectric layer, wherein the intermediate layer covers sidewalls of the opening and the first region;

exposing a second region of the semiconductor substrate through the intermediate layer, wherein a width of the first region is greater than a width of the second region;

etching the second region of the semiconductor substrate to form a through substrate via.

17. The method of claim 16, wherein a width of the first region ranges from about 215 microns (μm) to about 315 μm.

18. The method of claim 16, wherein a width of the second region ranges from about 155 μm to about 175 μm.

19. The method of claim 16, further comprising forming a passivation layer over the dielectric layer, wherein the passivation layer is between the dielectric layer and the intermediate layer.

20. The method of claim 16, wherein etching the second region comprises forming a tapered opening in the semiconductor substrate.

* * * * *